United States Patent
Choi

(10) Patent No.: US 8,203,140 B2
(45) Date of Patent: Jun. 19, 2012

(54) RESISTIVE MEMORY DEVICE AND METHOD FOR FABRICATING THE SAME

(75) Inventor: Sung-Yool Choi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 178 days.

(21) Appl. No.: 12/835,265

(22) Filed: Jul. 13, 2010

(65) Prior Publication Data

US 2011/0133152 A1    Jun. 9, 2011

(30) Foreign Application Priority Data

Dec. 4, 2009   (KR) .................. 10-2009-0119772

(51) Int. Cl.
*H01L 29/08*       (2006.01)
(52) U.S. Cl. .............. 257/40; 257/41; 257/E45.002; 257/E21.004; 438/99; 438/100
(58) Field of Classification Search ............. 257/40, 257/41, E45.002, E21.004; 438/99, 100
See application file for complete search history.

(56) References Cited

U.S. PATENT DOCUMENTS

| | | | |
|---|---|---|---|
| 6,128,214 A | 10/2000 | Kuekes et al. | |
| 6,734,478 B2 | 5/2004 | Johansson et al. | |
| 6,756,620 B2 | 6/2004 | Li et al. | |
| 6,921,912 B2 | 7/2005 | Campbell | |
| 7,179,534 B2 * | 2/2007 | Forrest et al. | 428/411.1 |
| 7,705,707 B2 * | 4/2010 | Lian et al. | 338/20 |
| 2005/0195640 A1 * | 9/2005 | Smith et al. | 365/151 |

FOREIGN PATENT DOCUMENTS

KR      2008-0095761 A      10/2008

OTHER PUBLICATIONS

R. Sezi, et al.,"Organic Materials for High-Density Non-Volatile Memory Applications", Infineon Technologies AG, IEDM, 2003, pp. 259-262.
Liping Ma, et al.,"Nonvolatile electrical bistability of organic/metal-nanocluster/organic system", Applied Physics Letters, vol. 82, Issue 9, 2003, pp. 1419-1421.
L.P. Ma, et al.,"Organic electrical bistable devices and rewritable memory cells", Applied Physics Letters, vol. 80, Issue 16, 2002, pp. 2997-2999.

* cited by examiner

*Primary Examiner* — Trung Q Dang
(74) *Attorney, Agent, or Firm* — Rabin & Berdo, P.C.

(57) ABSTRACT

A resistive memory device is provided. The resistive memory device includes a bottom electrode, a resistance-variable layer, and a top electrode. The resistance-variable layer is disposed on the bottom electrode. The top electrode is disposed on the resistance-variable layer. The resistance-variable layer includes a conductive polymer layer that reacts with the top electrode to form an oxide layer.

14 Claims, 7 Drawing Sheets

RESISTIVE MEMORY DEVICE AND METHOD FOR FABRICATING THE SAME

CROSS-REFERENCE TO RELATED APPLICATIONS

This U.S. non-provisional patent application claims priority under 35 U.S.C. §119 of Korean Patent Application No. 10-2009-0119772, filed on Dec. 4, 2009, the entire contents of which are hereby incorporated by reference.

BACKGROUND OF THE INVENTION

The present invention disclosed herein relates to nonvolatile memory devices and methods for fabricating the same, and more particularly, to resistive memory devices and methods for fabricating the same.

Examples of semiconductor memory devices used widely in recent years include Dynamic Random Access Memory (DRAM) devices, Static RAM (SRAM) devices, and flash memory devices. The semiconductor memory devices may be classified into volatile memory devices and nonvolatile memory devices. The volatile memory devices lose data, stored in memory cells, when power supply thereto is interrupted. Examples of the volatile memory devices include DRAM devices and SRAM devices. The nonvolatile memory devices retain data, stored in memory cells, even when power supply thereto is interrupted. Examples of the nonvolatile memory devices include flash memory devices.

Flash memory devices are mainly used for data storage in digital cameras, MP3 players, portable phones, etc. in order to store data even without power supply thereto. However, since the flash memory devices are configured to accumulate electric charge in floating gates by high electric fields, they have a complex cell structure, which causes an obstacle to high integration. Examples of the next-generation semiconductor memory devices for overcoming the above limitation include Ferroelectric RAM (FRAM) devices, Magnetic RAM (MRAM) devices, Phase-change RAM (PRAM) devices, and Resistive RAM (RRAM) devices.

SUMMARY OF THE INVENTION

Embodiments of the present invention provide resistive memory devices advantageous for high integration and methods for fabricating the same.

In some embodiments of the present invention, resistive memory devices include: a bottom electrode; a resistance-variable layer on the bottom electrode; and a top electrode on the resistance-variable layer, wherein the resistance-variable layer includes a conductive polymer layer that reacts with the top electrode to form an oxide layer.

In some embodiments, the conductive polymer layer includes a uniform mixture of poly(3,4-ethylenedioxythiophene) (PEDOT) and poly(styrenesulfonate) (PSS). The uniform mixture may have a PEDOT:PSS ratio of about 1:0.2 to about 1:5.

In other embodiments, the resistance-variable layer further includes an oxide layer formed by the reaction between the top electrode and the conductive polymer layer.

In further embodiments, the thickness of the oxide layer changes by a voltage applied to at least one of the top electrode and the bottom electrode. Also, the number of charge trap sites in the resistance-variable layer may change by a voltage applied to at least one of the top electrode and the bottom electrode.

In still further embodiments, the resistive memory devices further include a native oxide layer between the bottom electrode and the resistance-variable layer.

In still further embodiments, at least one of the top electrode and the bottom electrode includes at least one metal selected from the group consisting of aluminum (Al), titanium (Ti), nickel (Ni), chromium (Cr), silver (Ag), platinum (Pt), and tungsten (W). The oxide layer between the top electrode and the resistance-variable layer may be an oxide layer of the metal.

In still further embodiments, the resistance-variable layer has a plurality of conductivity states according to a voltage applied to at least one of the top electrode and the bottom electrode.

In other embodiments of the present invention, methods for fabricating a resistive memory device include: forming a bottom electrode; forming a resistance-variable layer on the bottom electrode; and forming a top electrode on the resistance-variable layer, wherein the resistance-variable layer is formed of a conductive polymer that reacts with the top electrode to form an oxide layer.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
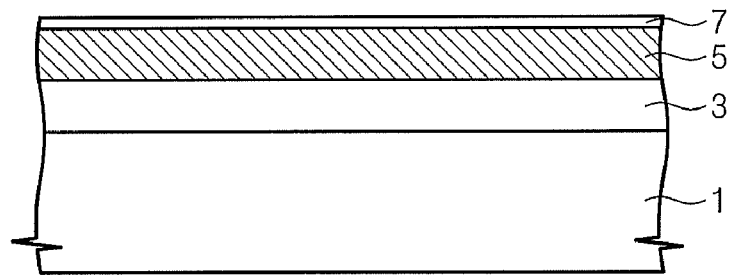
FIGS. 1 to 4 are sectional views illustrating a process for fabricating a resistive memory device according to an exemplary embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout the specification.

In the specification, it will be understood that when a layer (or film) is referred to as being 'on' another layer or substrate, it can be directly on the other layer or substrate, or intervening layers may also be present. It will also be understood that although the terms first, second and third are used herein to describe various layers or steps (or operations), these layers or steps should not be limited by these terms. These terms are used only to discriminate one layer or step from another layer or step.

In the following description, the technical terms are used only for explaining specific exemplary embodiments while not limiting the present invention. The terms of a singular form may include plural forms unless otherwise specified. The meaning of "include," "comprise," "including," or "comprising," specifies a property, a region, a fixed number, a step, a process, an element and/or a component but does not exclude other properties, regions, fixed numbers, steps, processes, elements and/or components.

Additionally, the embodiments in the detailed description will be described with reference to sectional views or plan views as ideal exemplary views of the present invention. In the drawings, the dimensions of layers and regions are exaggerated for clarity of illustration. Accordingly, shapes of the exemplary views may be modified according to fabrication techniques and/or allowable errors. Therefore, the embodiments of the present invention are not limited to the specific shape illustrated in the exemplary views, but may include other shapes that may be created according to fabrication processes. For example, an etched region illustrated as a rectangle may have rounded or curved features. Areas exemplified in the drawings have general properties, and are used to illustrate specific shapes of device regions. Thus, these should not be construed as limiting the scope of the present invention.

Hereinafter, exemplary embodiments of the present invention will be described in detail with reference to the accompanying drawings.

FIGS. 1 to 4 are sectional views illustrating a process for fabricating a resistive memory device according to an exemplary embodiment of the present invention.

Referring to FIG. 1, a dielectric layer 3 is formed on a substrate 1. For example, the substrate 1 may include a semiconductor substrate formed of silicon, or may include a plastic substrate formed of polyethersulfone (PES), poly(ethylene terephthalte (PET), polycarbonate (PC), or Polyimide (PI). The dielectric layer 3 may include a silicon oxide layer, a silicon nitride layer, or an organic polymer-based dielectric layer. The dielectric layer 3 may be used as a dielectric interlayer. A transistor may be formed on the substrate 1 before the forming of the dielectric layer 3. Thereafter, a bottom electrode 5 is formed on the dielectric layer 3. The bottom electrode 5 may be formed of metallic material such as aluminum (Al), copper (Cu), aurum (Au) and platinum (Pt), transparent material such as indium tin oxide (ITO), or doped polysilicon. The bottom electrode 5 may include a conductive layer formed through a sputtering process or a deposition process such as a chemical vapor deposition (CVD) process. An etching process may be performed so that the bottom electrode 5 may have the shape of a plurality of parallel lines. When the bottom electrode 5 is exposed to air, a native oxide layer 7 may be formed on the bottom electrode 5. Although not illustrated in FIG. 1, a glue layer, including metal such as titanium (Ti) or chromium (Cr), may be formed on the bottom electrode 5.

Figure 2:
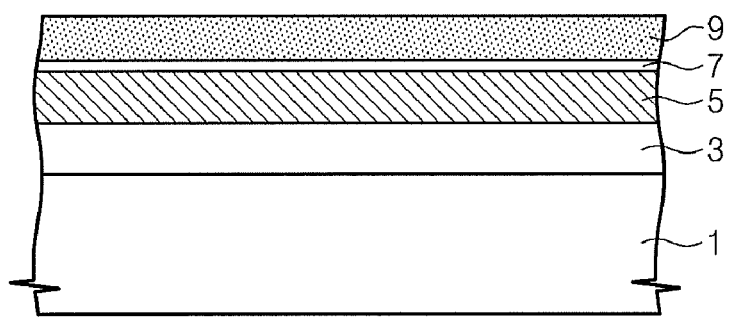

Referring to FIG. 2, a resistance-variable layer 9 is formed on the native oxide layer 7. The resistance-variable layer 9 may include a conductive polymer layer that reacts with a top electrode metal, which is to be formed thereon, to form an oxide layer at the interface between the top electrode metal and the resistance-variable layer 9. The conductive polymer layer may include a uniform mixture of poly(3,4-ethylenedioxythiophene) (hereinafter referred to as PEDOT) and poly (styrenesulfonate) (hereinafter referred to as PSS). The PEDOT has a structure of Chemical Formula 1.

[Chemical Formula 1]

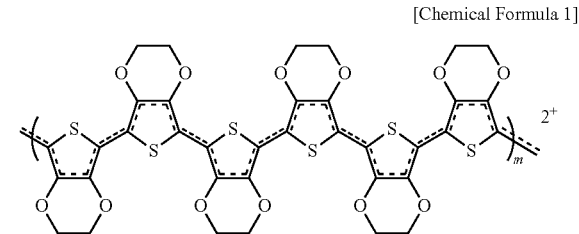

The PSS has a structure of Chemical Formula 2.

[Chemical Formula 2]

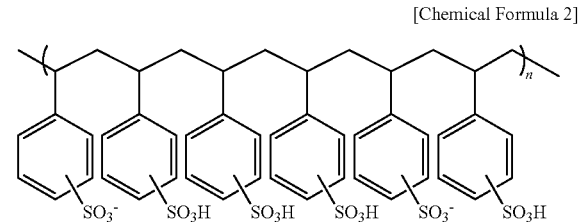

The uniform mixture may have a PEDOT:PSS ratio of about 1:0.2 to about 1:5. If formed to include a PEDOT:PSS conductive polymer layer, the resistance-variable layer 9 may be formed through a spin coating process or an ink-jet process. If formed through a spin coating process, the resistance-variable layer 9 is formed to cover the substrate 1 as illustrated in FIG. 2. If the resistance-variable layer 9 is formed through an ink-jet process, it is easy to form the resistance-variable layer 9 selectively at the intersection between the bottom electrode 5 and a subsequent top electrode. This obviates the need to etch the resistance-variable layer 9, thus making it possible to further simplify an overall fabrication process.

Figure 3:
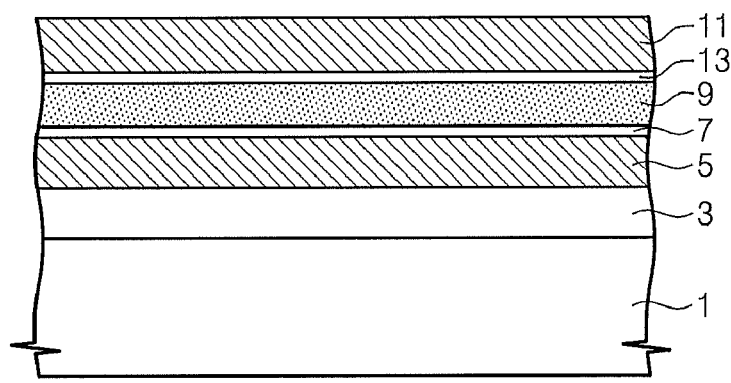

Referring to FIG. 3, a top electrode layer 11 is formed on the resistance-variable layer 9. The top electrode layer 11 may include at least one metal selected from the group consisting of aluminum (Al), titanium (Ti), nickel (Ni), chromium (Cr), silver (Ag), platinum (Pt), and tungsten (W). When the top electrode layer 11 is deposited on the resistance-variable layer 9, the oxygen in the resistance-variable layer 9 reacts with the top electrode layer 11 to form an oxide layer 13 at an interface therebetween. That is, a portion of the combined oxygen in the resistance-variable layer 9 resolves and combines with the metal of the top electrode layer 11, so that the bottom of the top electrode layer 11 is oxidized to form a metal oxide layer 13. Herein, charge trap sites are formed at the position of the combined oxygen in the resistance-variable layer 9. The number of the charge trap sites at the initial formation thereof may have a specific value before a voltage is applied thereto. When a voltage is subsequently applied to operate a resistive memory device, the number of the charge trap sites may vary depending on the applied voltage.

Figure 4:
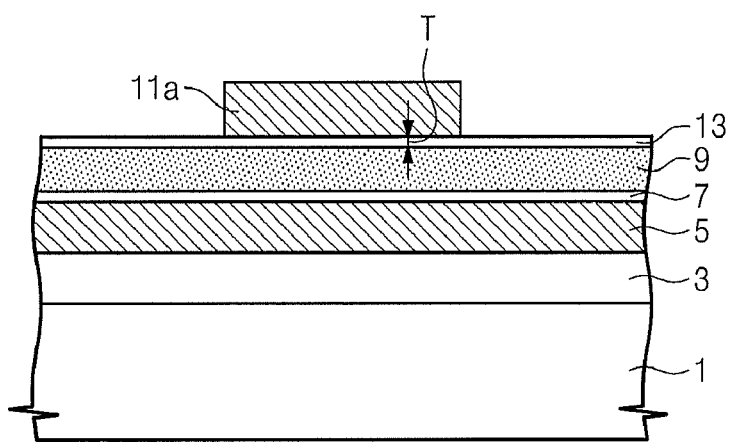

Referring to FIG. 4, the top electrode layer 11 is patterned to form a top electrode 11a having the shape of a plurality of parallel lines. The top electrode 11a may intersect the bottom electrode 5, thereby forming a resistive memory device according to the present invention. The thickness T of the oxide layer 13 between the top electrode 11a and the resistance-variable layer 9 may have a specific value at the initial formation thereof before a voltage is applied to the resistive memory device. When a voltage is applied to the resistive memory device, the thickness T of the oxide layer 13 may vary depending on the applied voltage. The electrical resistance between the top electrode and the bottom electrode decreases as the thickness of the oxide layer decreases and as the number of the charge trap sites increases. The operational characteristics of the resistive memory device may vary depending on the correlation between the thickness of the oxide layer and the number of the charge trap sites.

Figure 5A:
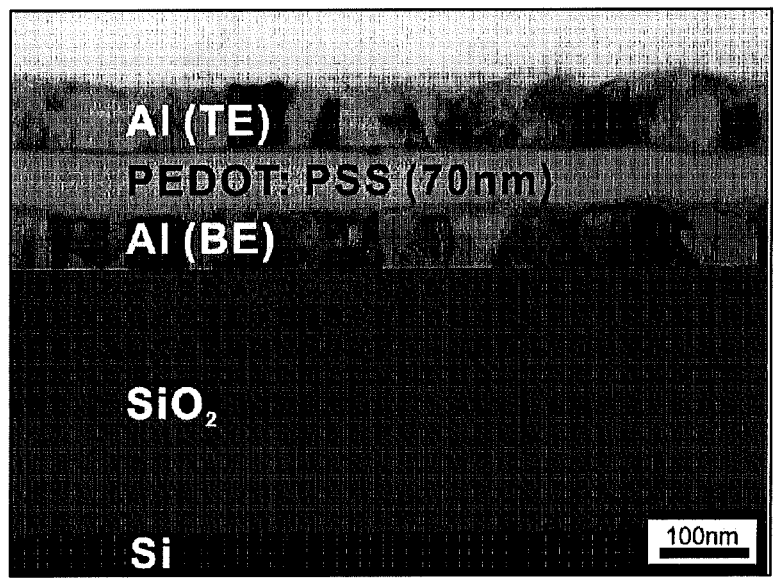
FIG. 5A is a sectional picture of a resistive memory device fabricated according to an exemplary embodiment of the present invention.
Figure 5B:
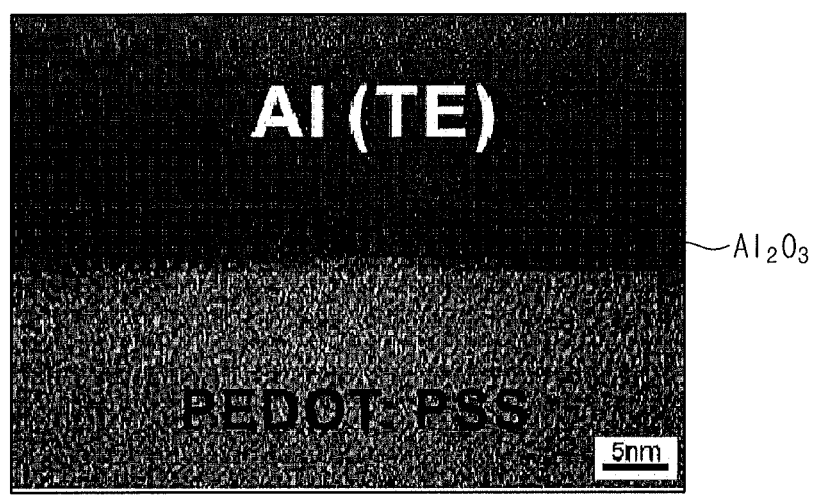
FIGS. 5B and 5C are partial expanded views of FIG. 5A.
Figure 5C:
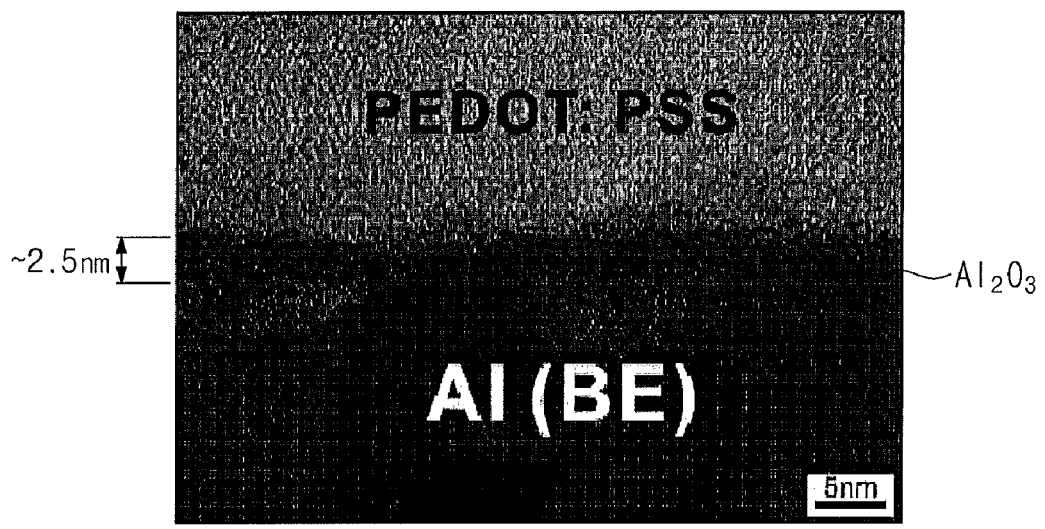

FIG. 5A is a sectional picture of a resistive memory device fabricated according to an exemplary embodiment of the present invention. FIGS. 5B and 5C are partial expanded views of FIG. 5A.

Referring to FIGS. 5A, 5B and 5C, a silicon oxide ($SiO_2$) layer was formed as a dielectric layer on a silicon (Si) substrate, and an aluminum (Al) layer was formed as a bottom electrode BE on the silicon oxide layer. Thereafter, a conductive polymer layer, including a mixture of PEDOT and PSS at a PEDOT:PSS ratio of about 1:2.2, was formed as a resistance-variable layer to a thickness of about 70 nm on the bottom electrode BE. Thereafter, an aluminum (Al) layer was formed as a top electrode TE on the resistance-variable layer. As illustrated in FIG. 5B, an aluminum oxide ($Al_2O_3$) layer was formed to a thickness of about 4 nm between the top electrode TE and the PEDOT:PSS layer. Also, as illustrated in FIG. 5C, an aluminum oxide ($Al_2O_3$) layer was formed as a native oxide layer to a thickness of about 2.5 nm on the bottom electrode BE. In the resistive memory device fabricated according to the exemplary embodiment, the density of charge trap sites formed in the resistance-variable layer was higher than about $1 \times 10^{17}$ sites/$cm^3$.

Figure 6:
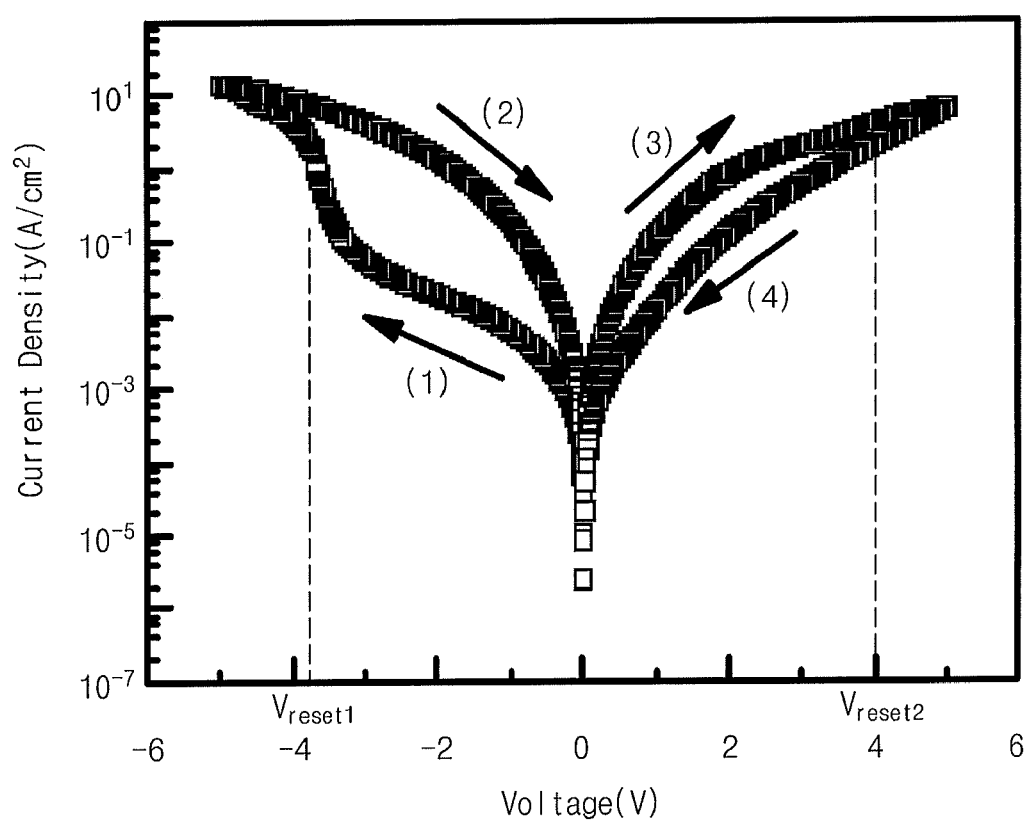
FIG. 6 is a voltage-current graph of a resistive memory device fabricated according to an exemplary embodiment of the present invention.
Figure 7A:
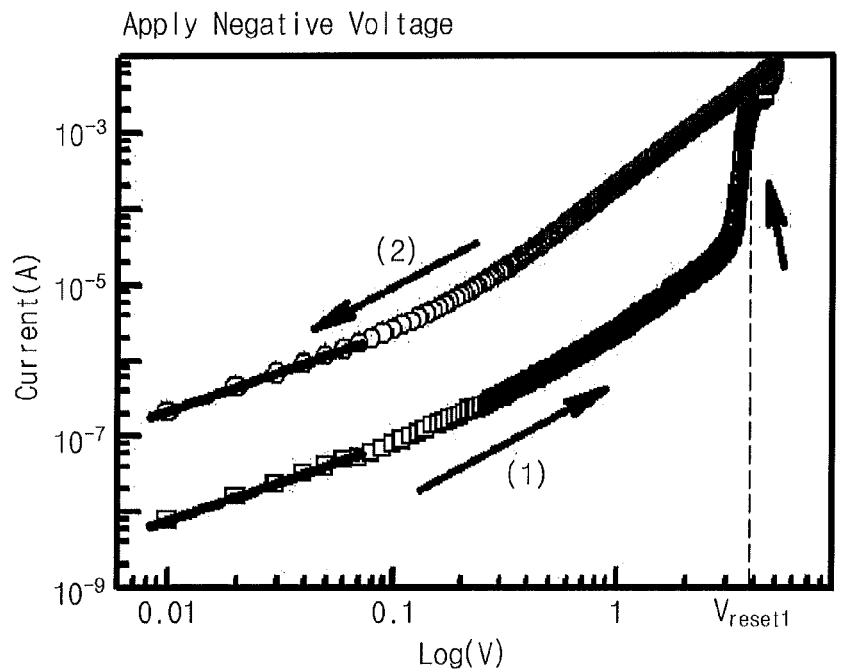
FIG. 7A is a log-scale graph of data obtained when applying negative voltages in the graph of FIG. 6.
Figure 7B:
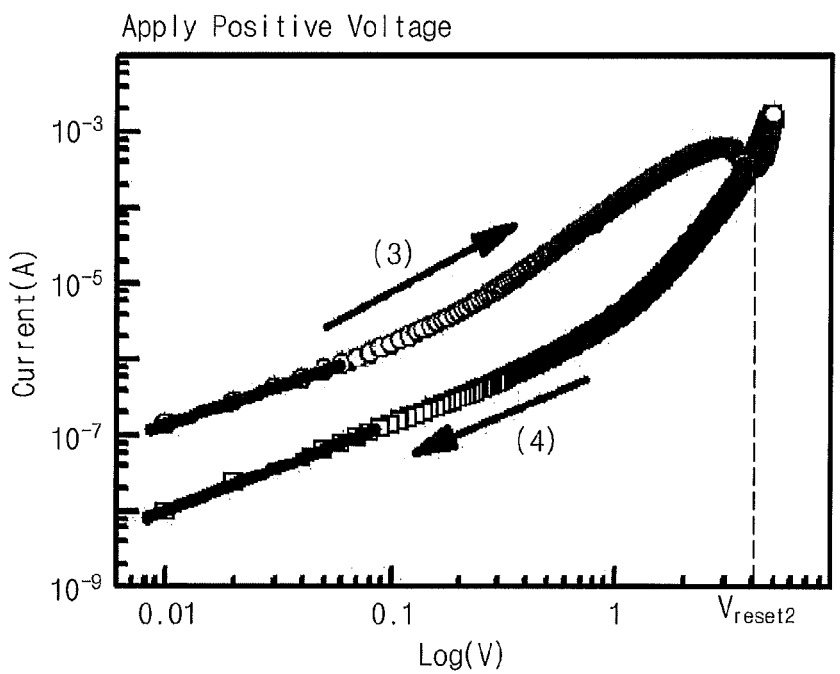
FIG. 7B is a log-scale graph of data obtained when applying positive voltages in the graph of FIG. 6.

The voltage-current characteristics of the resistive memory device illustrated in FIG. 5A will be described below with reference to FIGS. 6, 7A and 7B. FIG. 6 is a voltage-current graph of the resistive memory device fabricated according to an exemplary embodiment of the present invention. FIG. 7A is a log-scale graph of data obtained when applying negative voltages in the graph of FIG. 6. FIG. 7B is a log-scale graph of data obtained when applying positive voltages in the graph of FIG. 6.

Referring to FIGS. 6, 7A and 7B, a ground voltage is applied to the bottom electrode and a negative voltage is applied to the top electrode. As the absolute value of the negative voltage increases, the current density sensed in the resistive memory device changes along a curve (1). At this point, the thickness of the oxide layer (i.e., the aluminum oxide layer in FIG. 5B) between the top electrode and the resistance-variable layer may decrease gradually. On the other hand, the number of the charge trap sites in the resistance-variable layer may decrease. When the voltage decreases below a first reset voltage Vreset1 of about −4V, the current density increases suddenly. At this point, the resistive memory device changes from an OFF state to an ON state. Thereafter, as the absolute value of the negative voltage applied to the top electrode decreases, the current density sensed in the resistive memory device changes along a curve (2). When the negative voltage applied to the top electrode changes into a positive voltage, the sensed current density changes along a curve (3). When the voltage increases above a second reset voltage Vreset2 of about 4V, the resistive memory device changes from an ON state to an OFF state. Thereafter, as the voltage decreases, the current density changes along a curve (4). The graph of FIG. 6 shows the electric conductivity of two different states at the same voltage. The curves (2) and (3) show a high-conductivity state of an ON state, and the curves (1) and (4) show a low-conductivity state of an OFF state.

When a low voltage is applied to the resistance-variable layer, an ohmic current flows where the current is proportional to the voltage ($I \propto V$). When a high voltage is applied to the resistance-variable layer, a Space Charge Limited Current (SCLC) flows where the current is proportional to the square of the voltage ($I \propto V^2$). The SCLC is formed by a charge trap in the dielectric layer. A trap-unfilled SCLC flows when an electric charge is not trapped in the charge trap, and a trap-filled SCLC flows when an electric charge is trapped in the charge trap. The SCLC is determined according to Equation (1).

$$J = \frac{9}{8}\varepsilon\mu\theta\frac{V^2}{d^3} \quad (1)$$

where J denotes a current density, $\in$ is a permittivity, and μ denotes a charge mobility, V denotes a voltage, and d denotes the thickness of a dielectric layer.

In Equation (1), θ is the ratio of a free charge density 'n' to a trapped charge density '$n_t$', which is expressed as Equation (2).

$$\theta = \frac{n}{n_t} \quad (2)$$

The threshold voltage $V_T$ of the resistive memory device including the dielectric layer according to the present invention may be defined as a trap-filled limit voltage, which is expressed as Equation (3).

$$V_T = \frac{eN_t d^2}{2\varepsilon} \quad (3)$$

where $N_t$ denotes a trap density.

According to the Equation (3), the resistive memory device using an SCLC may control the threshold voltage and the current thereof by controlling the charge trap density, the permittivity of the dielectric layer and the thickness of the dielectric layer.

Herein, the charge trap in the dielectric layer may trap only one type of charge, i.e., one of electron and hole. If the charge trap is distributed non-uniformly in the vertical direction (i.e., the top and bottom) in the dielectric layer, the current flowing in the dielectric layer may be divided into a trap-filled SCLC and a trap-unfilled SCLC according to the direction of an external voltage applied thereto. The electric conductivity differs in the above two current states, and it may change into another state when a voltage higher than the threshold voltage is applied thereto. This phenomenon may be used to fabricate a resistive nonvolatile memory device, and the performance of the nonvolatile memory device may be controlled according to the dielectric types and the trap characteristics.

The resistive memory device according to an exemplary embodiment of the present invention includes a dielectric layer having a plurality of layers with different charge trap densities. Herein, an effective voltage applied to each of the layers may be controlled, and the strength of an electric field applied to each of the layers in the dielectric layer may be determined according to its thickness and permittivity. This may be controlled to implement a nonvolatile memory device with good operation characteristics.

Figure 8:
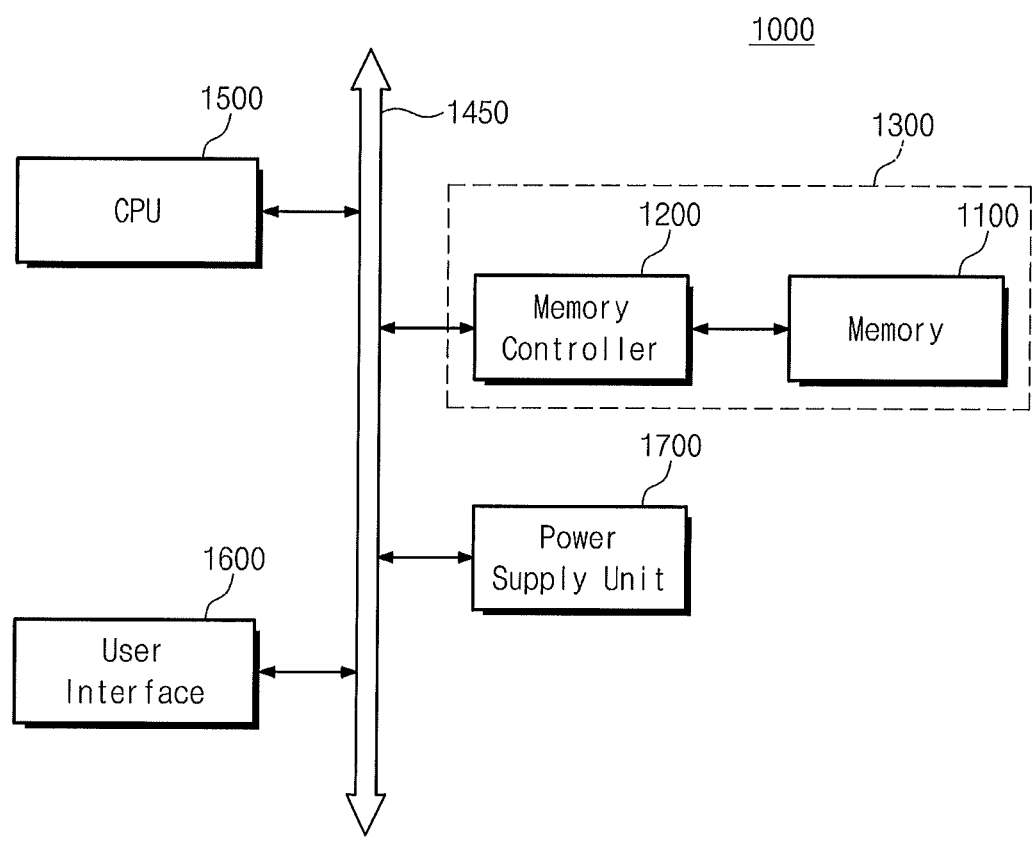
FIG. 8 is a block diagram of a memory system including a resistive memory device according to an exemplary embodiment of the present invention.

FIG. 8 is a block diagram of a memory system including a resistive memory device according to an exemplary embodiment of the present invention.

Referring to FIG. 8, a memory system 1000 according to an exemplary embodiment of the inventive concept includes a semiconductor memory device 1300, a central processing unit (CPU) 1500, a user interface 1600, and a power supply unit 1700 that are connected electrically to a system bus 1450. The semiconductor memory device 1300 includes a nonvolatile memory device (e.g., a resistive memory device such as an RRAM) 1100 and a memory controller 1200.

Data, which are provided through the user interface 1600 or processed by the CPU 1500, may be stored in the nonvolatile memory device 1100 through the memory controller 1200. The nonvolatile memory device 1100 may be configured using a solid state disk (SSD). When the nonvolatile memory device 1100 is configured using an SSD, the operation speed of the memory system 1000 may increase remarkably.

Although not illustrated in FIG. 8, those skilled in the art will readily understand that the memory system 1000 may further include an application chipset, a camera image processor, and a mobile DRAM.

Also, the memory system 1000 may be applicable to PDAs, portable computers, web tablets, wireless phones, mobile phones, digital music players, memory cards, or any device capable of transmitting/receiving information in wireless environments.

Also, the nonvolatile memory device 1100 or the memory system 1000 may be mounted in various types of packages. Examples of the packages of the nonvolatile memory device 1100 or the memory system 1000 include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

As described above, the resistive memory device according to the exemplary embodiment of the present invention includes a uniform conductive polymer mixture as a resistance-variable layer and has a plurality of conductivity states according to external voltages. Therefore, the resistivity memory device can provide uniform characteristics for each memory cell even when its size is reduced by high integration of semiconductor devices.

The above-disclosed subject matter is to be considered illustrative and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A resistive memory device comprising:
   a bottom electrode;
   a resistance-variable layer on the bottom electrode; and
   a top electrode on the resistance-variable layer,
   wherein the resistance-variable layer includes a conductive polymer layer that reacts with the top electrode to form an oxide layer.

2. The resistive memory device of claim 1, wherein the conductive polymer layer includes a uniform mixture of poly(3,4-ethylenedioxythiophene) (PEDOT) and poly(styrenesulfonate) (PSS).

3. The resistive memory device of claim 2, wherein the uniform mixture has a PEDOT:PSS ratio of about 1:0.2 to about 1:5.

4. The resistive memory device of claim 1, wherein the resistance-variable layer further includes an oxide layer formed by the reaction between the top electrode and the conductive polymer layer.

5. The resistive memory device of claim 4, wherein the thickness of the oxide layer is changed by a voltage applied to at least one of the top electrode and the bottom electrode.

6. The resistive memory device of claim 1, wherein a number of charge-trap sites in the resistance-variable layer is changed by a voltage applied to at least one of the top electrode and the bottom electrode.

7. The resistive memory device of claim 1, further comprising a native oxide layer between the bottom electrode and the resistance-variable layer.

8. The resistive memory device of claim 1, wherein at least one of the top electrode and the bottom electrode includes at least one metal selected from the group consisting of aluminum (Al), titanium (Ti), nickel (Ni), chromium (Cr), silver (Ag), platinum (Pt), and tungsten (W).

9. The resistive memory device of claim 8, wherein the oxide layer is an oxide layer of the metal.

10. The resistive memory device of claim 1, wherein the resistance-variable layer has a plurality of conductivity states according to a voltage applied to at least one of the top electrode and the bottom electrode.

11. A method for fabricating a resistive memory device, comprising:
    forming a bottom electrode;
    forming a resistance-variable layer on the bottom electrode; and
    forming a top electrode on the resistance-variable layer,
    wherein the resistance-variable layer includes a conductive polymer layer that reacts with the top electrode to form an oxide layer.

12. The method of claim 11, wherein the oxide layer is formed between the top electrode and the resistance-variable layer during the forming of the top electrode.

13. The method of claim 11, wherein the conductive polymer layer includes a uniform mixture of poly(3,4-ethylenedioxythiophene) (PEDOT) and poly(styrenesulfonate) (PSS).

14. The method of claim 13, wherein the uniform mixture has a PEDOT:PSS ratio of about 1:0.2 to about 1:5.

* * * * *